(12) United States Patent
Okamoto et al.

(10) Patent No.: US 8,008,727 B2
(45) Date of Patent: Aug. 30, 2011

(54) SEMICONDUCTOR INTEGRATED CIRCUIT DEVICE INCLUDING A PAD AND FIRST MOSFET

(75) Inventors: Hitoshi Okamoto, Kanagawa (JP); Morihisa Hirata, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 730 days.

(21) Appl. No.: 12/010,991

(22) Filed: Jan. 31, 2008

(65) Prior Publication Data

US 2008/0185653 A1 Aug. 7, 2008

(30) Foreign Application Priority Data

Feb. 1, 2007 (JP) ................. 2007-022976

(51) Int. Cl.
*H01L 23/62* (2006.01)
(52) U.S. Cl. ............... 257/361; 361/91.1; 257/E27.015; 438/170
(58) Field of Classification Search .................. 257/361, 257/E27.015; 438/170; 361/91.1
See application file for complete search history.

(56) References Cited

U.S. PATENT DOCUMENTS

| 6,399,990 B1 | 6/2002 | Brennan et al. |
| 2002/0070408 A1* | 6/2002 | Schnaitter ..................... 257/356 |

FOREIGN PATENT DOCUMENTS

JP 7-147381 6/1995

* cited by examiner

*Primary Examiner* — Thao X Le
*Assistant Examiner* — Matthew Gordon
(74) *Attorney, Agent, or Firm* — McGinn IP Law Group, PLLC

(57) ABSTRACT

To reduce the leak current in the MOSFET connected between the pad and the ground. There are provided a pad PAD for an input or output signal, an n-type MOSFET M1*a* connected between the pad PAD and the ground and having its gate terminal and backgate connected in common, and a potential control circuit 10 that controls a potential Vb of the gate terminal and the backgate of the n-type MOSFET M1*a* based on a potential Vin of the pad PAD. The potential control circuit 10 comprises n-type MOSFETs M2 and M3; the n-type MOSFET M1*a* has its gate terminal and backgate connected to backgates and drains of the n-type MOSFETs M2 and M3; the n-type MOSFET M2 has its source grounded and its gate terminal connected to the pad PAD via a resistance R; and the n-type MOSFET M3 has its source connected to the pad PAD and its gate terminal grounded.

20 Claims, 11 Drawing Sheets

⊠ : CONTACT

SEMICONDUCTOR INTEGRATED CIRCUIT DEVICE INCLUDING A PAD AND FIRST MOSFET

REFERENCE TO RELATED APPLICATION

This application is based upon and claims the benefit of the priority of Japanese patent application No. 2007-022976, filed on Feb. 1, 2007, the disclosure of which is incorporated herein in its entirety by reference thereto.

FIELD OF THE INVENTION

The present invention relates to a semiconductor integrated circuit device, and particularly to a semiconductor integrated circuit device comprising an electrostatic discharge protection circuit using a MOS-type protection device that performs a parasitic bipolar transistor operation.

BACKGROUND OF THE INVENTION

A semiconductor integrated circuit (IC) is required to be resistant to surge voltage and surge current caused by electrostatic discharge (ESD) and loaded on the input/output pad of the IC. In order to meet this requirement, an ESD protection circuit is generally connected to the input/output pad of IC. As such an ESD protection circuit, a MOS-type protection device that performs a parasitic bipolar transistor operation is used.

FIG. 9 is a circuit diagram of a conventional ESD protection circuit using a MOS-type protection device. In FIG. 9, an n-type MOSFET 101 has its drain connected to a pad 102 while its gate, backgate, and source are grounded in common. When a positive ESD surge is applied to the pad 102, the n-type MOSFET 101 performs a parasitic bipolar transistor operation because of the breakdown of the p-n junction between the drain and the backgate, and functions so as to release the surge current from the pad 102 to the ground. Further, when a negative ESD surge is applied to the pad 102, the n-type MOSFET 101 functions so as to release the surge current from the ground to the pad 102 since the p-n junction between the drain and the backgate is forward-biased.

When a positive signal is supplied to the pad 102, the signal is not attenuated by the n-type MOSFET 101 since the drain-backgate junction of the n-type MOSFET 101 is reverse-biased. However, when a signal having a larger value than the forward voltage drop of the p-n junction in the negative direction is supplied to the pad 102, the drain-backgate junction of the n-type MOSFET 101 is forward-biased, the signal flows through the n-type MOSFET 101, and the attenuation of the signal occurs. Note that, if the MOSFET 101 is p-type, the attenuation of signal will occur when a positive signal is supplied to the pad 102.

In Patent Document 1, an ESD protection circuit that does not attenuate signals even when a signal larger than the power supply voltage is supplied to the input terminal is disclosed. As shown in FIG. 10A, this ESD protection circuit comprises an input terminal 111, a power supply terminal (Vdd) 112, an N-well (backgate), and a P-channel transistor 113 having its drain and source (or source and drain) connected to the input terminal and the power supply terminal respectively in the N-well. A gate of the P-channel transistor 113 is connected to the N-well and the gate and the N-well are in a floating state.

Further, another configuration in which a second P-channel transistor 114 having its drain and source or source and drain connected to the input terminal 111 and the gate of the P-channel transistor 113 respectively and a gate of the second P-channel transistor 114 is connected to the power supply terminal Vdd as shown in FIG. 10B is disclosed in Patent Document 1. According to Patent Document 1, the second P-channel transistor 114 is said to help increasing the gate potential of the first P-channel transistor 113, thereby further improving the protection capability.

Further, as shown in FIG. 11, an NMOS transistor 120 having its source grounded, its drain connected to a pad 116, and its gate and backgate (P-well) grounded via an NMOS transistor 128 is disclosed as an ESD protection circuit in Patent Document 2. The NMOS transistor 128 is controlled by a gate 125 so that it turns on when the circuit operates and turns off when no current is supplied to the chip. Further, a backgate of the NMOS transistor 128 is grounded according to Patent Document 2.

[Patent Document 1]
Japanese Patent Kokai Publication No. JP-A-7-147381
[Patent Document 2]
U.S. Pat. No. 6,399,990B1 (Description)

SUMMARY OF THE DISCLOSURE

The following analyses are given by the present invention. The entire disclosure of the above mentioned patent documents are incorporated herein by reference thereto.

In the ESD protection circuit shown in FIG. 10A, since the gate and the N-well (backgate) remain in a floating state even when a signal equal to, larger or smaller than the power supply voltage is supplied to the input terminal 111, the p-n junction in the P-channel transistor 113 turns on in the forward direction and the signal is not attenuated. However, the signal supplied to the input terminal changes the potential of the gate and the N-well (backgate) via the parasitic capacitance that exists between the drain (or the source) and the gate and the N-well (backgate) because the gate and the N-well (backgate) are in a floating state. The P-channel transistor 113 cannot remain in an off state fully because of this fluctuation in potential, and as a result, a leak current will flow between the drain and the source.

Further, in FIG. 10B, when a signal smaller than the power supply voltage is supplied to the input terminal 111, the P-channel transistor 114 provided does not operate, therefore, it does not help the charging of the backgate (N-well) in the P-channel transistor 113. As a result, the P-channel transistor 113 does not stably remain in an off state and a leak current will flow.

Further, the backgate of the NMOS transistor 128 is grounded in the ESD protection circuit shown in FIG. 11. Because of this, when a signal having a negative potential is supplied to the pad 116, the p-n junction between the drain and the backgate of the NMOS transistor 120 and the p-n junction between the drain and the backgate of the NMOS transistor 128 become forward-biased relative to the ground. As a result, a leak current will flow between the pad 116 and the ground.

A semiconductor integrated circuit device relating to an aspect of the present invention comprises a pad for an input or output signal; a first MOSFET connected between the pad and a power supply wiring of a predetermined potential and having its gate terminal and backgate connected in common; and a second MOSFET of the same conductivity type as the first MOSFET having its gate terminal connected to the pad, its first terminal and backgate connected to the gate terminal and the backgate of the first MOSFET, and its second terminal connected to the power supply wiring.

A semiconductor integrated circuit device relating to another aspect of the present invention comprises a pad for an input or output signal; a first MOSFET connected between the pad and a power supply wiring of a potential V0 and having its gate terminal and backgate connected in common; and a potential control circuit that controls a potential Vb of the gate terminal and the backgate of the first MOSFET based on a potential Vin of the pad. The potential control circuit controls so that, if the first MOSFET is n-type, Vb=V0 when Vin≧V0+Vth (where Vth is a predetermined positive potential), and Vb=Vin when Vin<V0−Vth, and if the first MOSFET is p-type, Vb=Vin when Vin≧V0+Vth, and Vb=V0 when Vin<V0−Vth.

The meritorious effects of the present invention are summarized as follows.

According to the present invention, a leak current in a first MOSFET connected between a pad and a power supply wiring can be reduced even when a signal having a potential higher or lower than the predetermined potential of the power supply wiring is applied to the pad.

BRIEF DESCRIPTIONS OF THE DRAWINGS

PREFERRED MODES OF THE INVENTION

A semiconductor integrated circuit device relating to an example of the present invention comprises a pad (PAD in FIG. 1) for an input or output signal, a first MOSFET (M1 in FIG. 1) connected between the pad and a power supply wiring of a predetermined potential (the ground in FIG. 1) and having its gate terminal and backgate connected in common, and a second MOSFET (M2 in FIG. 1) of the same conductivity type as the first MOSFET having its gate terminal connected to the pad, its first terminal and backgate connected to the gate terminal and the backgate of the first MOSFET, and its second terminal connected to the power supply wiring.

Here, it is preferred that the threshold voltage of the first MOSFET be larger than the p-n junction forward voltage.

The semiconductor integrated circuit device may further comprise a third MOSFET (M3 in FIG. 3) of the same conductivity type as the first MOSFET having its gate terminal connected to the power supply wiring, its first terminal and backgate connected to the gate terminal and the backgate of the first MOSFET, and its second terminal connected to the pad.

Further, the semiconductor integrated circuit device may comprise a pad (PAD in FIG. 2) for an input or output signal, a first MOSFET (M1a in FIG. 2) connected between the pad and a power supply wiring of a potential V0 (the ground in FIG. 2) and having its gate terminal and backgate connected in common, and a potential control circuit (10 in FIG. 2) that controls a potential Vb of the gate terminal and the backgate of the first MOSFET based on a potential Vin of the pad. This potential control circuit controls so that, if the first MOSFET is n-type, Vb=V0 when Vin≧V0+Vth (where Vth is a predetermined positive potential), and Vb=Vin when Vin<V0−Vth, and if the first MOSFET is p-type, Vb=Vin when Vin≧V0+Vth, and Vb=V0 when Vin<V0−Vth.

Here, the potential control circuit (10 in FIG. 2) may comprise second and third MOSFETs (M2 and M3 in FIG. 3) of the same conductivity type as the first MOSFET; the first MOSFET may have its gate terminal and backgate connected to backgates and first terminals of the second and third MOSFETs; the second MOSFET may have its second terminal connected to the power supply wiring and its gate terminal connected to the pad; and the third MOSFET may have its second terminal connected to the pad and its gate terminal connected to the power supply wiring.

Further, a resistance element (R in FIG. 3) may be inserted between the gate terminal of the second MOSFET and the pad.

Figure 4A:
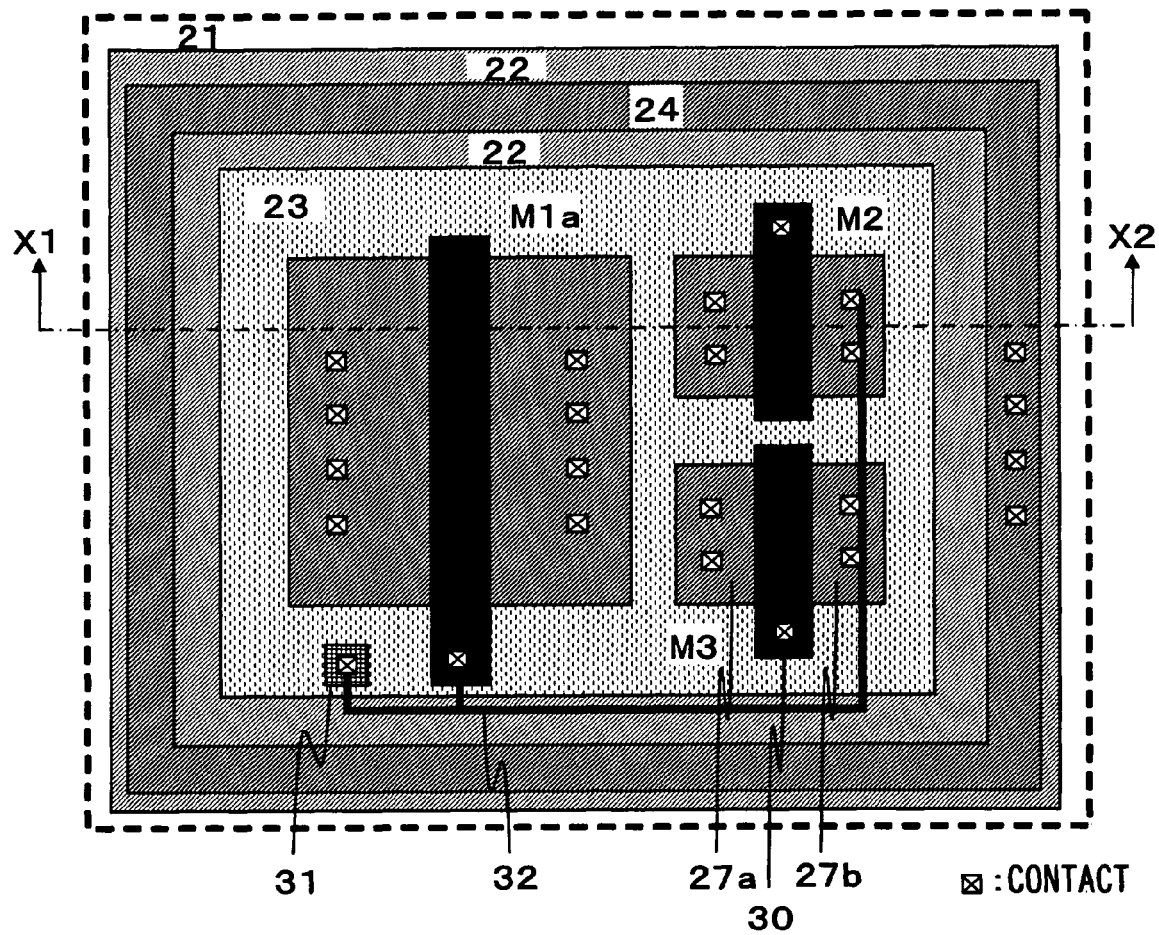
FIG. 4A is a plan of the semiconductor integrated circuit device comprising the ESD protection circuit relating to the second example of the present invention.
Figure 4B:
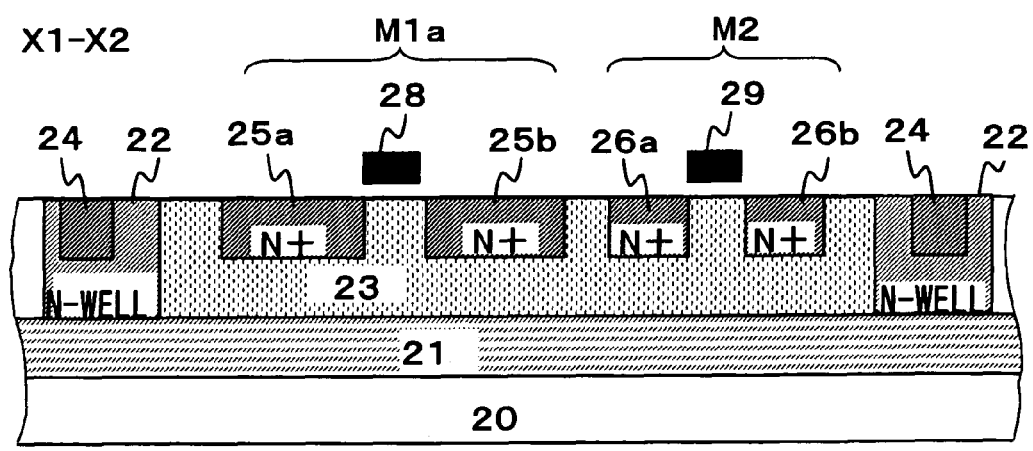
FIG. 4B is a cross-sectional view of the semiconductor integrated circuit device comprising the ESD protection circuit relating to the second example of the present invention.

Further, it is preferred that the first, second, and third MOSFETs be disposed in the same well region (23 in FIGS. 4A and 4B).

Figure 5:
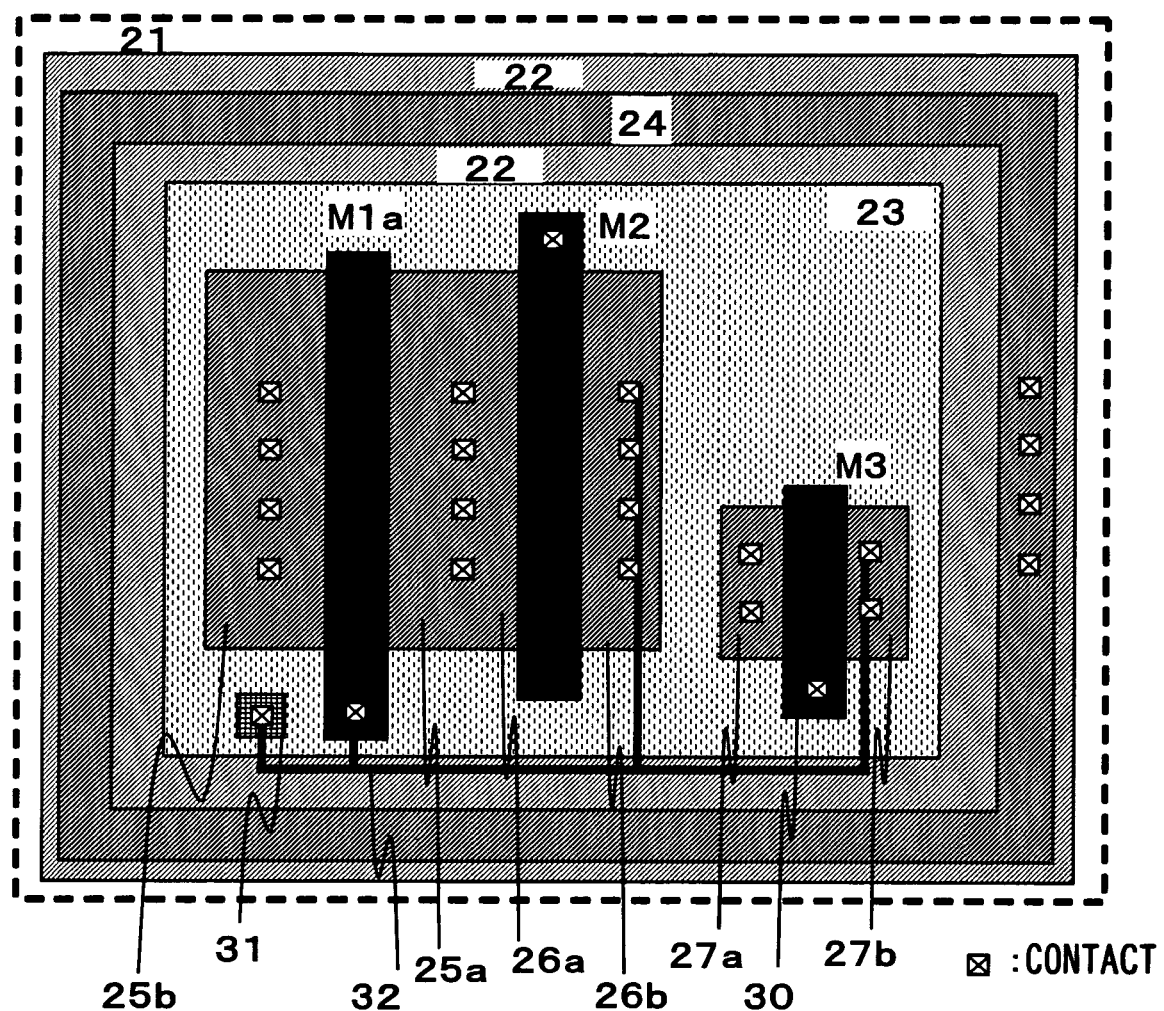
FIG. 5 is a plan of a semiconductor integrated circuit device comprising an ESD protection circuit relating to a third example of the present invention.

Further, a diffusion region associated with a second terminal in the first MOSFET and a diffusion region associated with the second terminal in the second MOSFET may be a common region (25a and 26a in FIG. 5).

Figure 6:
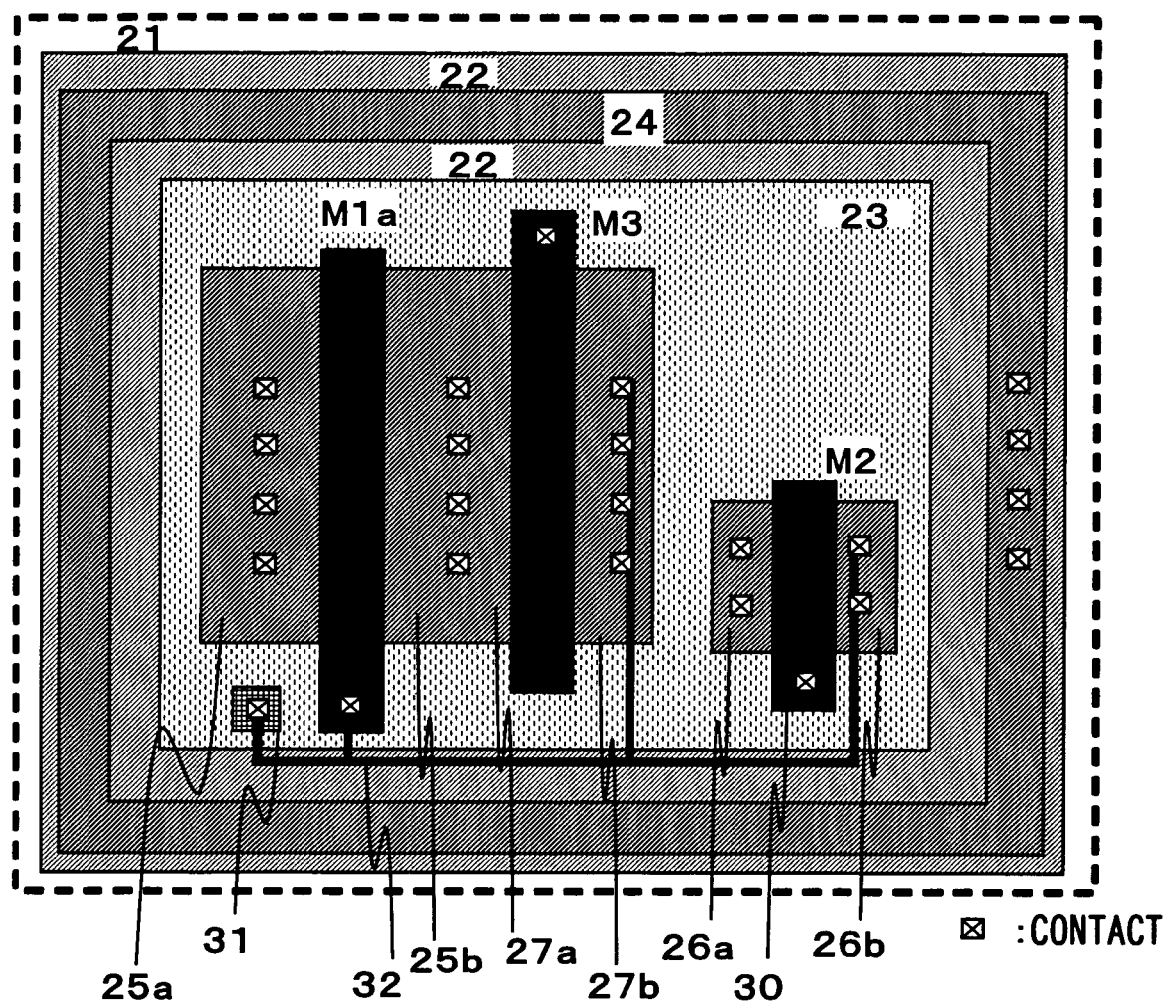
FIG. 6 is a plan of a semiconductor integrated circuit device comprising an ESD protection circuit relating to a fourth example of the present invention.

Further, a diffusion region associated with a first terminal in the first MOSFET and a diffusion region associated with the second terminal in the third MOSFET may be a common region (25b and 27a in FIG. 6).

Figure 7:
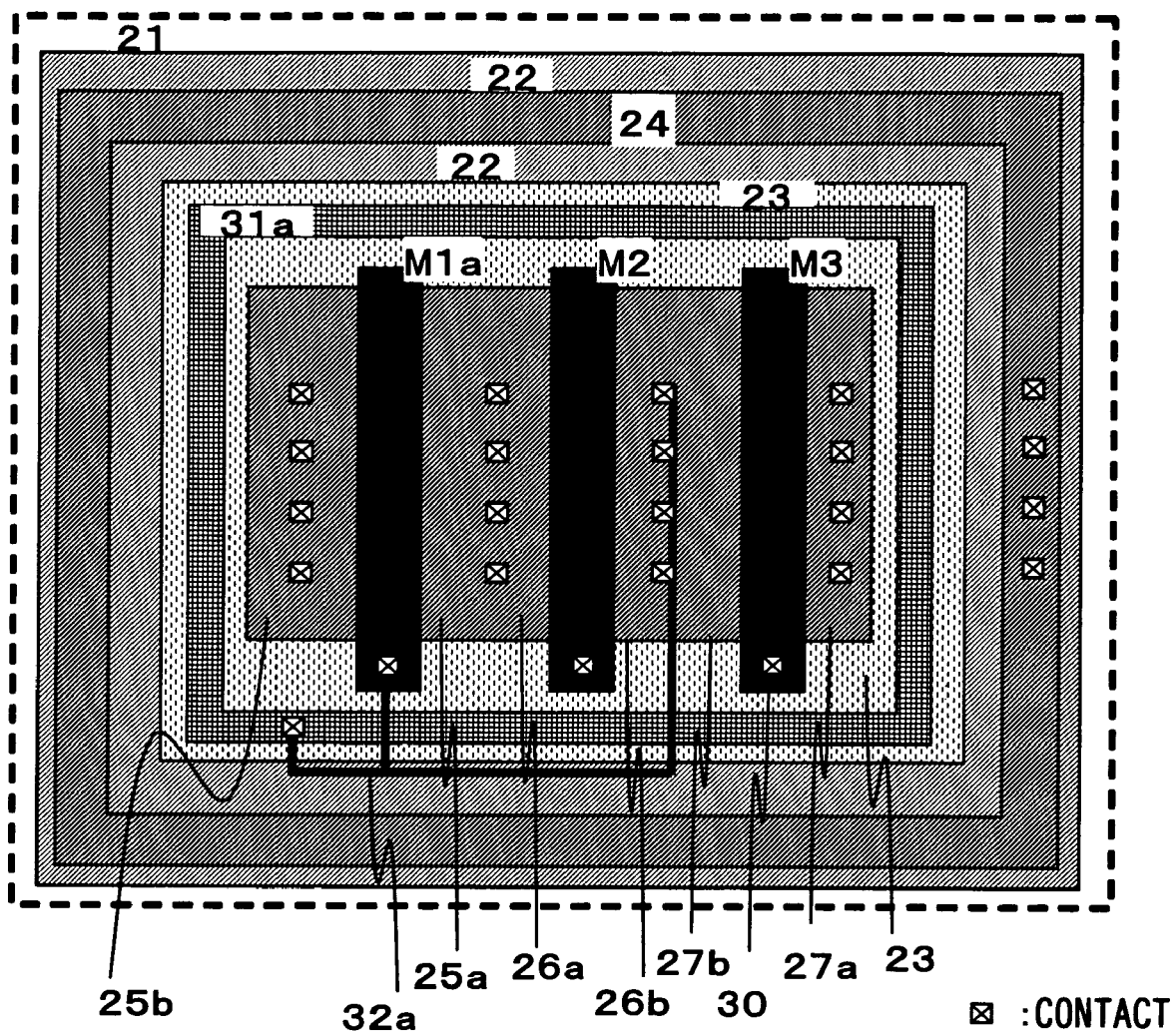
FIG. 7 is a plan of a semiconductor integrated circuit device comprising an ESD protection circuit relating to a fifth example of the present invention.

Further, a diffusion region associated with the first terminal in the second MOSFET and a diffusion region associated with the first terminal in the third MOSFET may be a common region (26b and 27b in FIG. 7). The present invention will be described in detail with reference to examples.

Example 1

Figure 1:
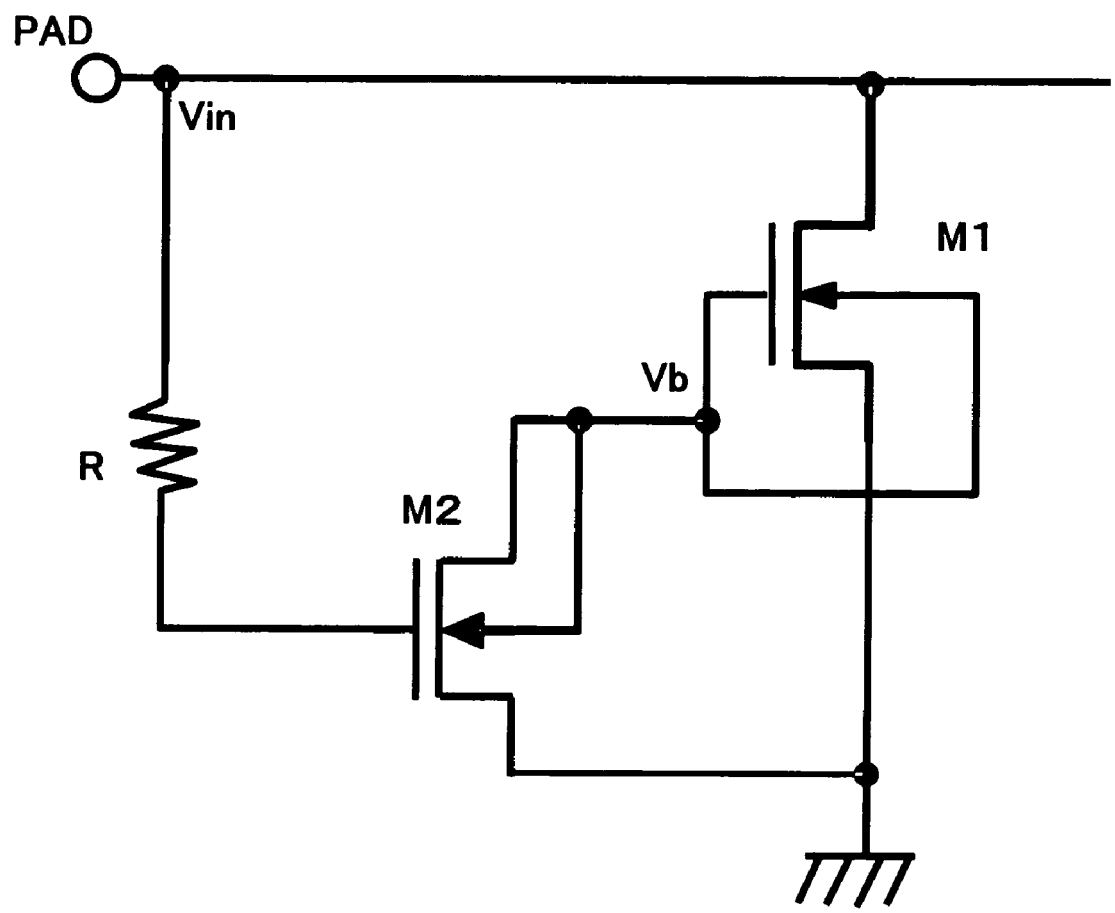
FIG. 1 is a circuit diagram of a semiconductor integrated circuit device comprising an ESD protection circuit relating to a first example of the present invention.

FIG. 1 is a circuit diagram of a semiconductor integrated circuit device comprising an ESD protection circuit relating to a first example of the present invention. In FIG. 1, the semiconductor integrated circuit device comprises a pad PAD, an n-type MOSFET M1, an n-type MOSFET M2, and a resistance R. The pad PAD is a terminal for an input or output signal of the semiconductor integrated circuit device, and is connected to an internal circuit not shown in the diagram. The n-type MOSFET M1 has its drain connected to the pad PAD, its source grounded, and its gate terminal and backgate connected in common. The n-type MOSFET M1 is structured such that the threshold voltage is larger than the forward voltage drop of the p-n junction. Further, the n-type MOSFET M2 has its drain and backgate connected to the gate terminal and the backgate of the n-type MOSFET M1, its gate terminal connected to the pad PAD via the resistance R, and its source grounded. Further, it is preferred that the resistance R be inserted in order to prevent an ESD surge applied to the pad PAD from being directly applied to the gate terminal of the n-type MOSFET M2.

When used as an output, for instance, the pad PAD can be used as a voltage monitor of a charge pump (built into an LSI) that generates positive/negative voltages used during write/erase operations to flash memory at the time of testing an LSI. Meanwhile, used as an input, for instance, the pad PAD can be used to receive power when positive/negative voltages used during write/erase operations to flash memory at the time of testing an LSI or used as a consumer product are supplied externally from outside of the LSI. The pad PAD described as above is exposed outside of the semiconductor integrated circuit device and is prone to receive an ESD surge.

In the semiconductor integrated circuit device described as above, when a positive ESD surge is applied to the pad PAD, a parasitic bipolar transistor turns on and operates in the n-type MOSFET M1 because of the breakdown of the p-n junction between the drain and the backgate, and the n-type MOSFET M1 functions so as to release the surge current from the pad PAD to the ground. Further, when a negative ESD surge is applied to the pad PAD, the parasitic bipolar transistor turns on and operates in the n-type MOSFET M1 because of the breakdown of the p-n junction between the source and the backgate, and the n-type MOSFET M1 functions so as to release the negative surge current from the pad PAD to the ground.

Further, when the breakdown of the p-n junction between the drain and the backgate in the n-type MOSFET M1 does not occur and a signal having a positive voltage Vin larger than the threshold voltages of the n-type MOSFETs M1 and M2 is supplied to the pad PAD, the n-type MOSFET M2 is turned on. Therefore, the potential Vb of the gate terminal and backgate of the n-type MOSFET M1 becomes the ground potential and the n-type MOSFET M1 is fully turned off, preventing a leak current from flowing between the drain and the source.

On the other hand, when the breakdown of the p-n junction between the source and the backgate in the n-type MOSFET M1 does not occur and a signal having a negative voltage Vin larger than the threshold voltages of the n-type MOSFETs M1 and M2 in the negative direction is supplied to the pad PAD, the n-type MOSFET M2 is turned off. Further, the potential Vb of the gate terminal and backgate of the n-type MOSFET M1 becomes higher than the signal Vin by the amount of the p-n junction forward voltage drop. Therefore, the n-type MOSFET M1, whose threshold voltage is larger than the p-n junction forward voltage drop, is fully turned off, preventing a leak current from flowing between the drain and the source.

Example 2

Figure 2:
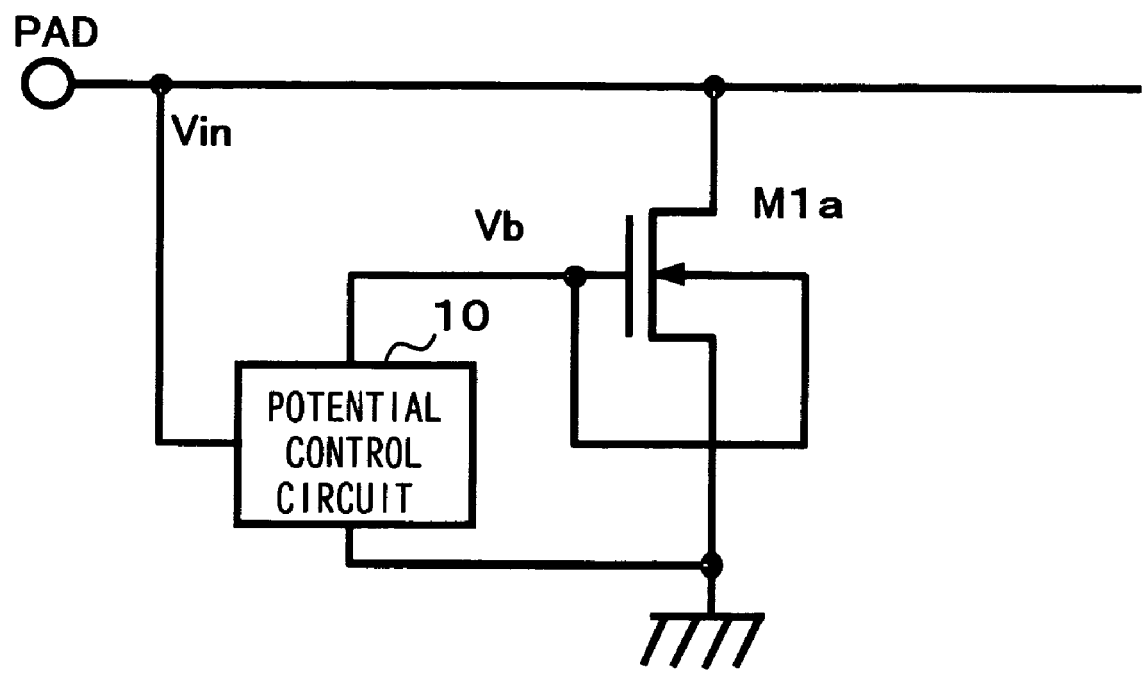
FIG. 2 is a circuit diagram of a semiconductor integrated circuit device comprising an ESD protection circuit relating to a second example of the present invention.

FIG. 2 is a circuit diagram of a semiconductor integrated circuit device comprising an ESD protection circuit relating to a second example of the present invention. In FIG. 2, the semiconductor integrated circuit device comprises the pad PAD, an n-type MOSFET M1a, and a potential control circuit 10. The symbols same as the ones in FIG. 1 indicate the same things, thus the explanations of them will be omitted. The n-type MOSFET M1a is connected identically to the n-type MOSFET M1 in FIG. 1, however, it is not necessary to set its threshold voltage to a voltage larger than the p-n junction forward voltage drop. The potential control circuit 10 is connected to the pad PAD, a gate terminal and backgate of the n-type MOSFET M1a, and the ground, and controls the potential Vb of the gate terminal and backgate of the n-type MOSFET M1a based on the potential Vin of the pad. More concretely, it controls so that Vb=0 when Vin≧Vth (where Vth is the threshold voltage of the n-type MOSFET M1a), and Vb=Vin when Vin<−Vth.

Figure 3:
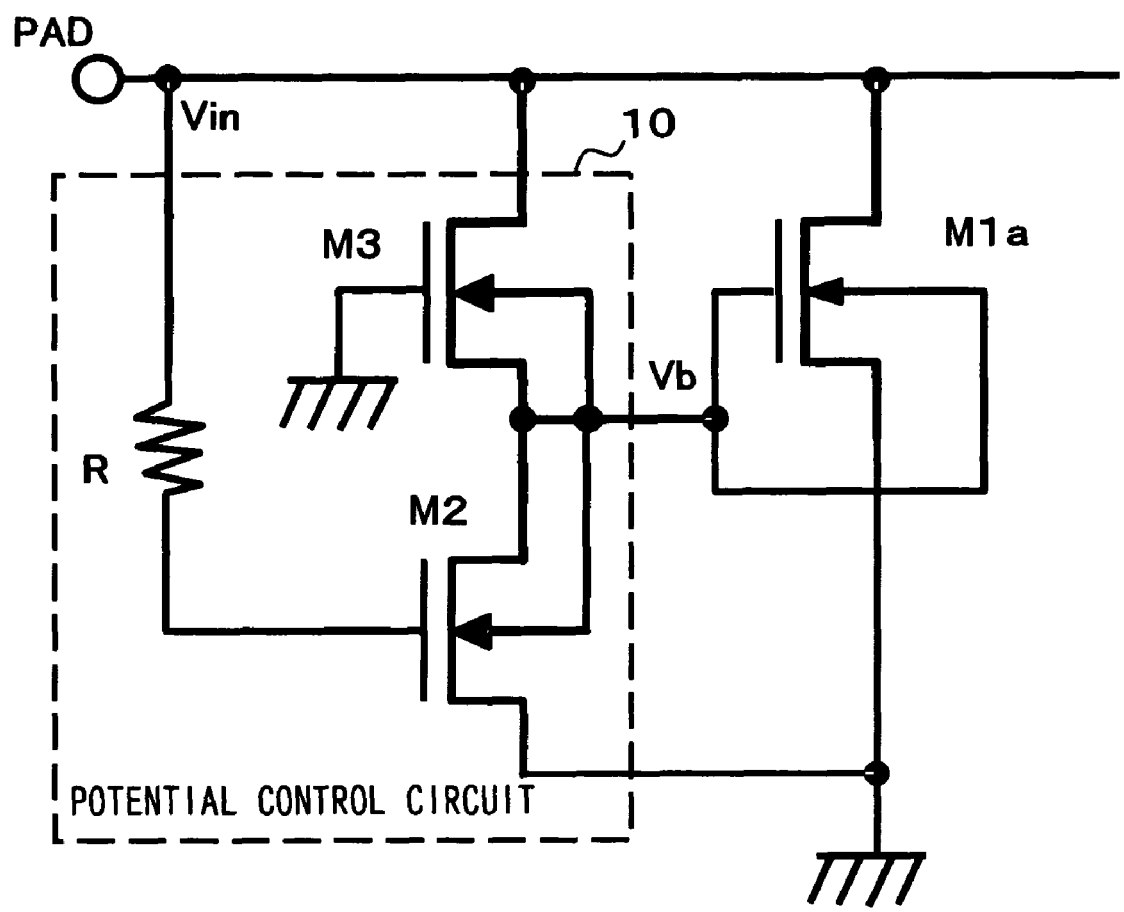
FIG. 3 is a circuit diagram of a potential control circuit.

FIG. 3 is a circuit diagram of the potential control circuit 10. In FIG. 3, the potential control circuit 10 comprises the n-type MOSFET M2, the n-type MOSFET M3, and the resistance R. The n-type MOSFET M2 is connected as shown in FIG. 1. The n-type MOSFET M3 has its source connected to the pad PAD, its gate terminal grounded, its drain and backgate connected to the gate terminal and the backgate of the n-type MOSFET M1a.

In the semiconductor integrated circuit device configured as above, when an ESD surge is applied to the pad PAD, as in Example 1, the n-type MOSFET M1a performs a parasitic bipolar transistor operation and functions so as to release the surge current.

Further, when the breakdown of the p-n junction between the drain and the backgate in the n-type MOSFET M1a does not occur and a positive signal Vin larger than the threshold voltages of the n-type MOSFETs M1a and M2 is supplied to the pad PAD, the n-type MOSFET M2 is turned on. Therefore, the potential Vb of the gate terminal and backgate of the n-type MOSFET M1a becomes the ground potential and the n-type MOSFET M1a is fully turned off, preventing a leak current from flowing between the drain and the source.

On the other hand, when the breakdown of the p-n junction between the source and the backgate in the n-type MOSFET M1a does not occur and a negative signal Vin larger than the threshold voltages of the n-type MOSFETs M1a and M3 in the negative direction is supplied to the pad PAD, the n-type MOSFET M3 is turned on. Therefore, the potential of the gate terminal and the backgate of the n-type MOSFET M1a becomes Vin, and the n-type MOSFET M1a is fully turned off, preventing a leak current from flowing between the drain and the source.

Note that the drain and the source of the MOSFETs are defined for the sake of convenience in the above descriptions. Since the drain and the source are interchangeable in the structure of the MOSFETs, the drain can be the source and the source can be the drain.

Next, the structure of the semiconductor integrated circuit device will be described. FIG. 4A is a plan of the semiconductor integrated circuit device comprising the ESD protection circuit relating to the second example of the present invention. Further, FIG. 4B is a cross-sectional view taken along a line X1-X2 in FIG. 4A. In FIGS. 4A and 4B, the semiconductor integrated circuit device comprises a deep N-well 21 located in a deep part of a semiconductor P-substrate 20. Further, above the deep N-well 21, it comprises a P-well 23 and an N-well 22 that horizontally surrounds the P-well 23. On the surface of the P-well 23, N+ diffusion layers 25a, 25b, 26a, 26b, 27a, and 27b are provided. It further comprises a gate electrode 28, with an insulating film interposed, above the P-well 23 and between the N+ diffusion layers 25a and 25b. Further, a gate electrode 29, with an insulating film interposed, is provided above the P-well 23 and between the N+ diffusion layers 26a and 26b. Further, a gate electrode 30, with an insulating film interposed, is provided above the P-well 23 and between the N+ diffusion layers 27a and 27b. An N+ diffusion layer 24 is provided on the surface of the N-well 22, which is connected to, for instance, a highest potential Vdd (not shown in the drawings) of the semiconductor integrated circuit device via a contact and functions as a guard ring.

In the semiconductor integrated circuit device structured as above, the n-type MOSFET M1a is formed by the N+ diffusion layers 25a and 25b and the gate electrode 28; the n-type MOSFET M2 is formed by the N+ diffusion layers 26a and 26b, and the gate electrode 29; and the n-type MOSFET M3 is formed by the N+ diffusion layers 27a and 27b, and the gate electrode 30. Here, the n-type MOSFETs M1a, M2, and M3 are formed on the common P-well 23, and the P-well 23 forms the common backgate of the n-type MOSFETs M1a, M2, and M3. Further, the gate electrode 28 and the N+ diffusion layers 26b and 27b are connected to a P+ diffusion layer 31 in the P-well 23 by a wiring 32 via a contact. In other words, each backgate of the n-type MOSFETs M1a, M2, and M3, the gate electrode 28 of the n-type MOSFET M1a, the N+ diffusion layer 26b that corresponds to the drain of the n-type MOSFET M2, and the N+ diffusion layer 27b that corresponds to the drain of the n-type MOSFET M3 are connected in common.

Further, the N+ diffusion layer 25b that corresponds to the drain of the n-type MOSFET M1a and the N+ diffusion layer 27a that corresponds to the source of the n-type MOSFET M3 are connected in common to the pad PAD by a wiring, not shown in FIG. 4B, via contacts. Further, the N+ diffusion layer 25a that corresponds to the source of the n-type MOSFET M1a and the N+ diffusion layer 26a that corresponds to the source of the n-type MOSFET M2 are connected in common to the ground by a wiring not shown in the Figure via a contact. Further, the gate electrode 30 of the n-type MOSFET M3 is grounded by a wiring not shown in the drawings. Further, the gate electrode 29 of the n-type MOSFET M2 is connected to the pad PAD via the resistance R not shown in the Figure.

In the semiconductor integrated circuit device structured as above, the backgates of the n-type MOSFETs M1a, M2, and M3 are formed as the common P-well 23, therefore the occupation area of the ESD protection circuit can be reduced. In FIG. 4A, the sizes of the n-type MOSFETs M2 and M3 are enlarged relative to the size of the n-type MOSFET M1a. In practical use, the n-type MOSFETs M2 and M3 only need the capability to drive the potential of the P-well 23, and their sizes can be one several tenths of that of the n-type MOSFET M1a that needs to release an ESD surge current.

Example 3

FIG. 5 is a plan of a semiconductor integrated circuit device comprising an ESD protection circuit relating to a third example of the present invention. The circuit diagram of the ESD protection circuit relating to the third example is the same as FIG. 3. Further, in FIG. 5, the symbols same as the ones in FIGS. 4A and 4B indicate the same things, thus the explanations of them will be omitted. In the semiconductor integrated circuit device shown in FIG. 5, the locations of the N+ diffusion layers 25a and 25b in the n-type MOSFET M1a in FIG. 4B are interchanged (as mentioned above, the source and the drain are interchangeable, therefore the location interchange does not mean anything in a practical sense). Further, the N+ diffusion layer 25a in the n-type MOSFET M1a and the N+ diffusion layer 26a in the n-type MOSFET M2 in FIG. 4B are formed as one N+ diffusion layer in the P-well 23. Referring to the circuit diagram in FIG. 3, this means that the source of the n-type MOSFET M1a and the source of the n-type MOSFET M2 are grounded in common. In the semiconductor integrated circuit device structured as above, the occupation area of the ESD protection circuit can be further reduced.

Example 4

FIG. 6 is a plan of a semiconductor integrated circuit device comprising an ESD protection circuit relating to a fourth example of the present invention. The circuit diagram of the ESD protection circuit relating to the fourth example is the same as FIG. 3. Further, in FIG. 6, the symbols same as the ones in FIGS. 4A and 4B indicate the same things, thus the explanations of them will be omitted. In the semiconductor integrated circuit device shown in FIG. 6, the N+ diffusion layer 25b in the n-type MOSFET M1a and the N+ diffusion layer 27a in the n-type MOSFET M3 in FIGS. 4A and 4B are formed as one N+ diffusion layer in the P-well 23. Referring to the circuit diagram in FIG. 3, this means that the drain of the n-type MOSFET M1a and the source of the n-type MOSFET M3 are connected in common to the pad PAD. In the semiconductor integrated circuit device structured as above, the occupation area of the ESD protection circuit can be further reduced as in Example 3.

Example 5

FIG. 7 is a plan of a semiconductor integrated circuit device comprising an ESD protection circuit relating to a fifth example of the present invention. The circuit diagram of the ESD protection circuit relating to the fifth example is the same as FIG. 3. Further, in FIG. 7, the symbols same as the ones in FIG. 5 indicate the same things, thus the explanations of them will be omitted. In the semiconductor integrated circuit device shown in FIG. 7, the N+ diffusion layer 26b in the n-type MOSFET M2 and the N+ diffusion layer 27b in the n-type MOSFET M3 in FIG. 5 are formed as one N+ diffusion layer in the P-well 23. Further, a P+ diffusion layer 31a surrounding the n-type MOSFETs M1a, M2, and M3 is formed in the P-well 23. Referring to the circuit diagram in FIG. 3, this means that the drain of the n-type MOSFET M2 and the drain of the n-type MOSFET M3 are connected in common to the P-well 23 via the P+ diffusion layer 31a. In the semiconductor integrated circuit device structured as above, the occupation area of the ESD protection circuit can be further reduced as in Examples 3 and 4.

Example 6

Figure 8:
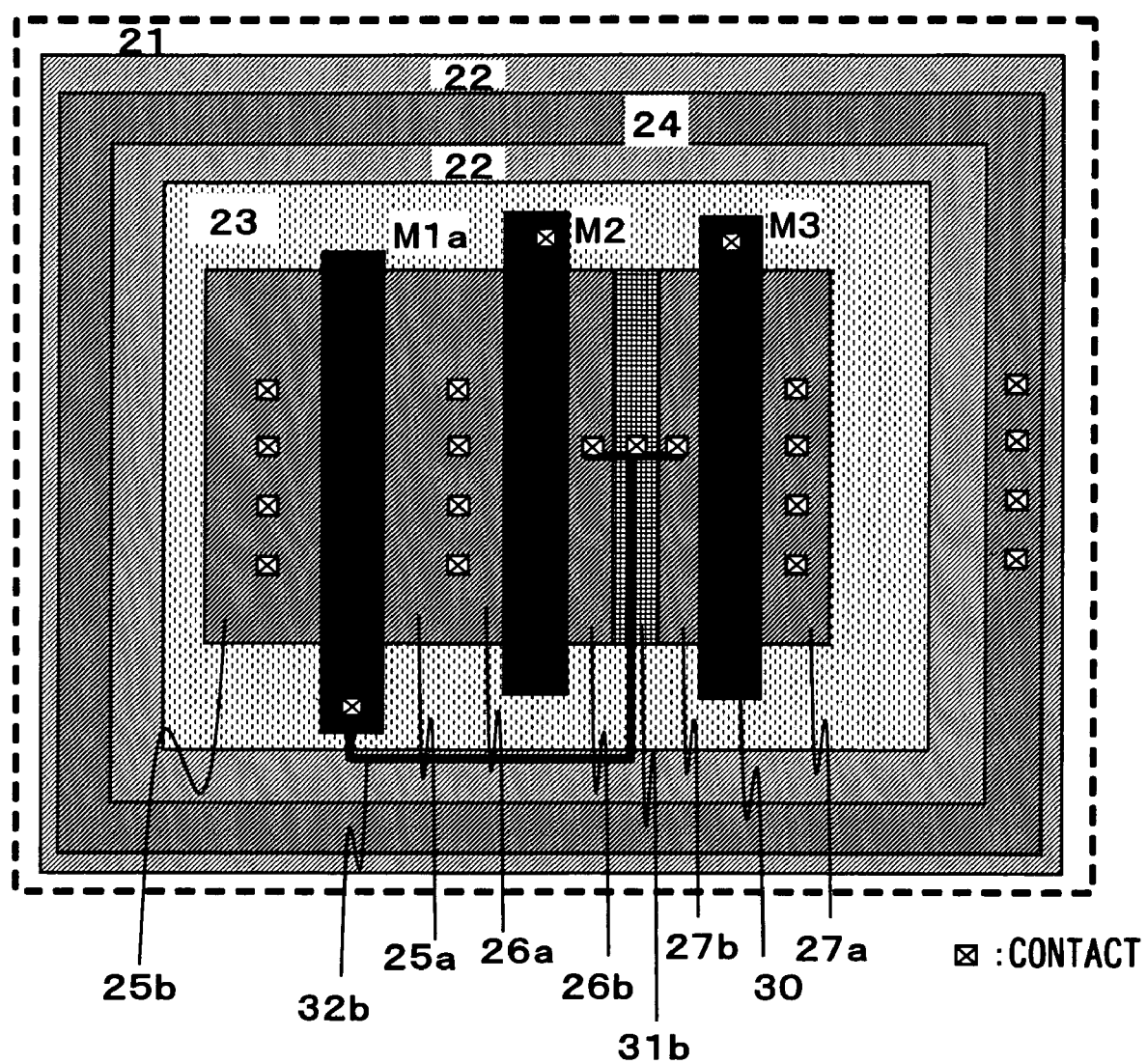
FIG. 8 is a plan of a semiconductor integrated circuit device comprising an ESD protection circuit relating to a sixth example of the present invention.
Figure 9:
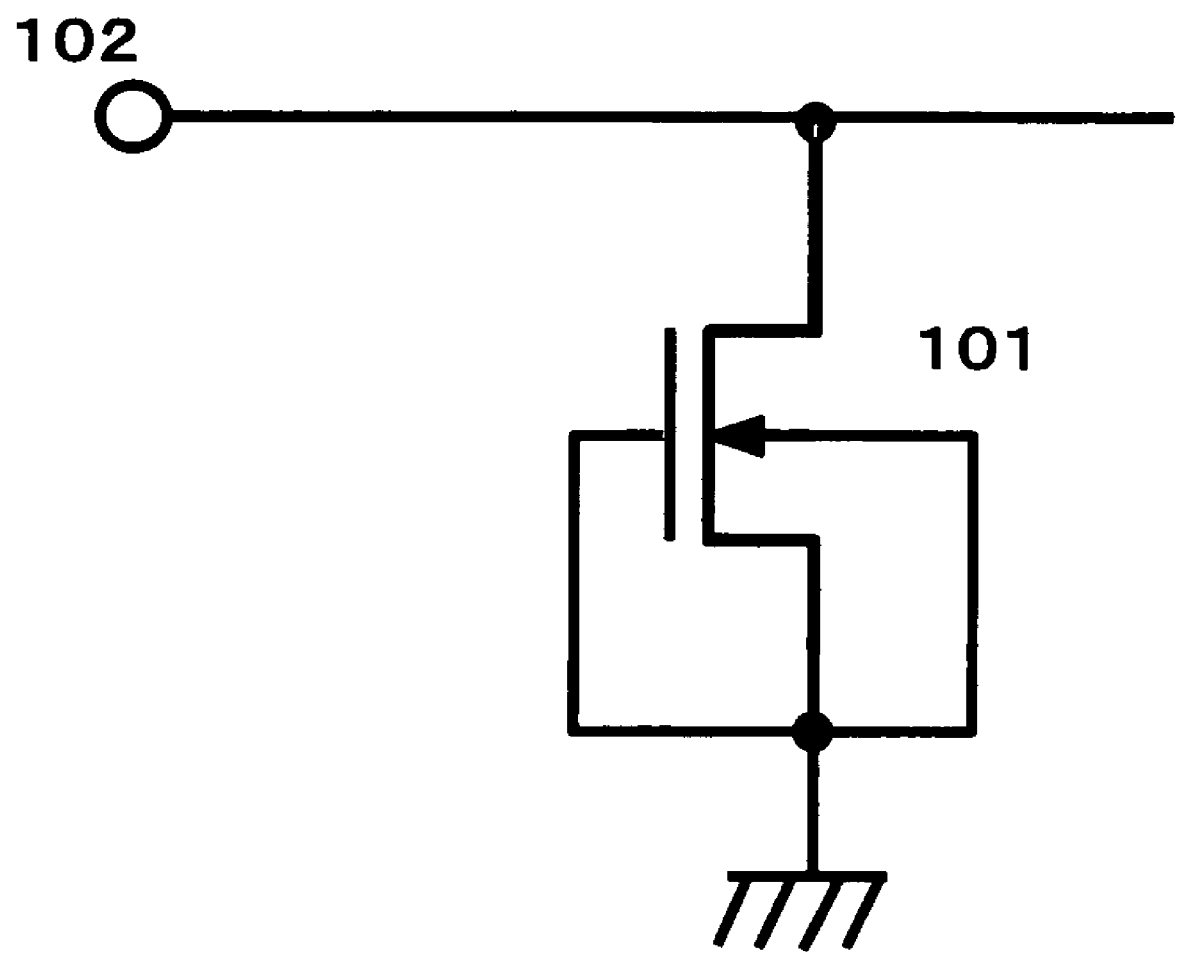
FIG. 9 is a circuit diagram of a conventional ESD protection circuit using a MOS-type protection device.
Figure 10A:
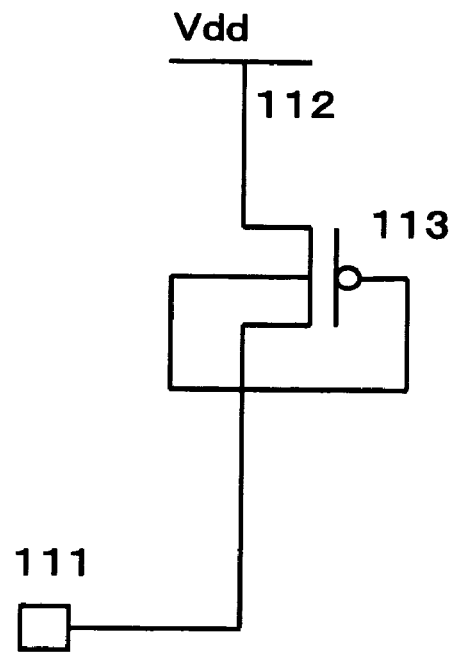
FIGS. 10A and 10B are other circuit diagrams of the conventional ESD protection circuit using a MOS-type protection device.
Figure 10B:
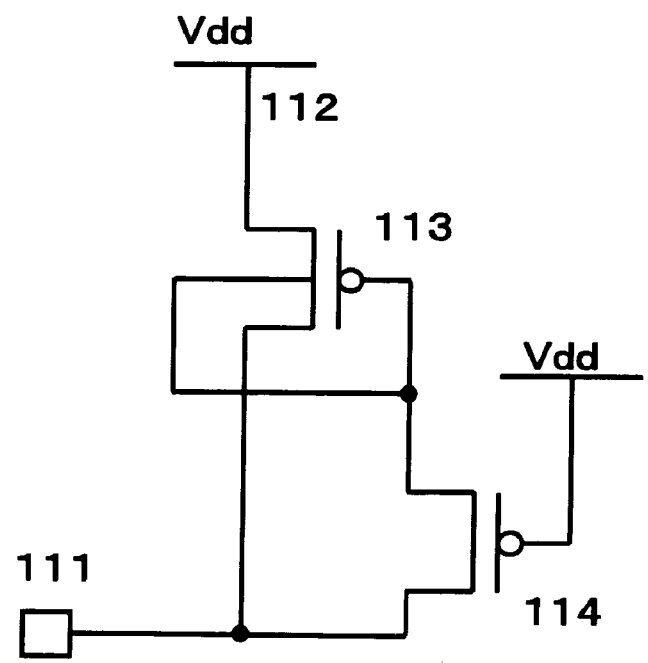
Figure 11:
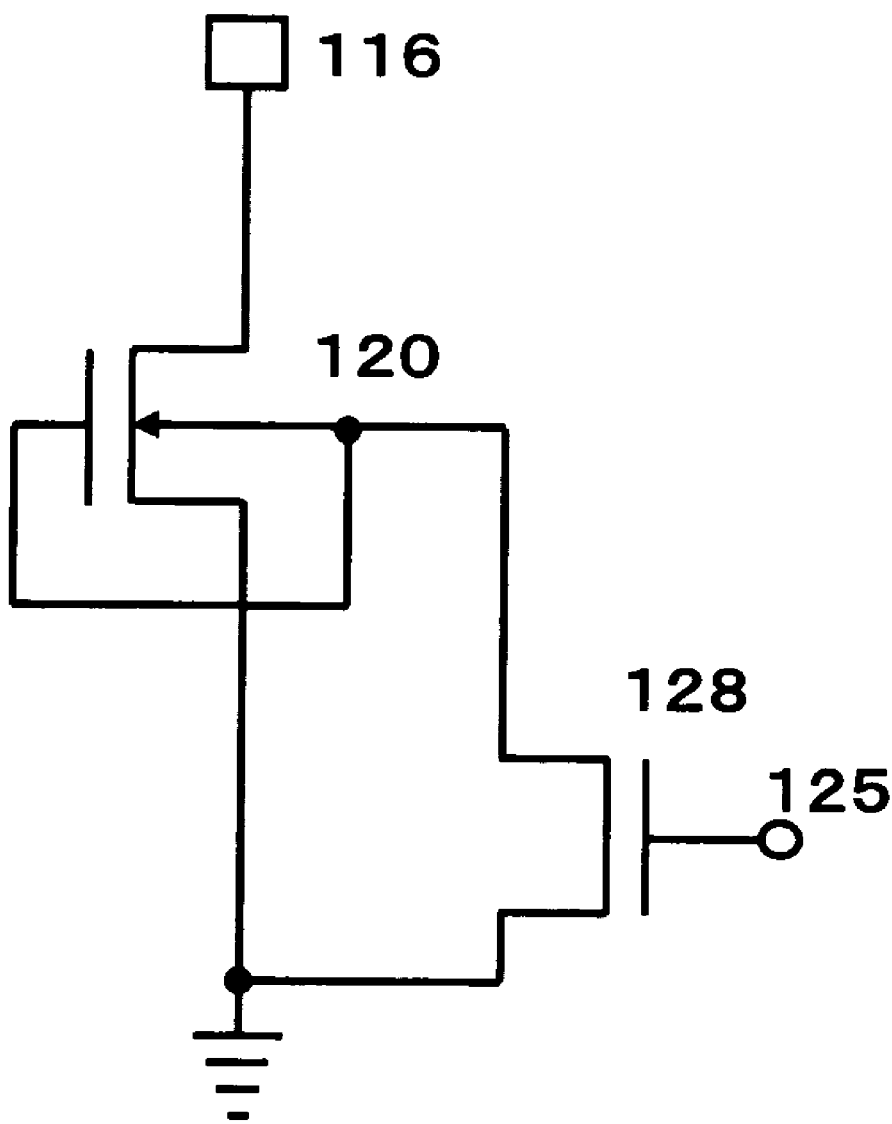
FIG. 11 is a circuit diagram of another conventional ESD protection circuit using a MOS-type protection device.

FIG. 8 is a plan of a semiconductor integrated circuit device comprising an ESD protection circuit relating to a sixth example of the present invention. The circuit diagram of the ESD protection circuit relating to the sixth example is the same as FIG. 3. Further, in FIG. 8, the symbols same as the ones in FIG. 5 indicate the same things, thus the explanations of them will be omitted. In the semiconductor integrated circuit device shown in FIG. 8, a P+ diffusion layer 31b is formed between the N+ diffusion layer 26b in the n-type MOSFET M2 and the N+ diffusion layer 27b in the n-type MOSFET M3 in FIG. 5. The N+ diffusion layer 26b, the N+ diffusion layer 27b, and the P+ diffusion layer 31b are wired in common to the gate electrode of the n-type MOSFET M1a by wiring 32b. Referring to the circuit diagram in FIG. 3, this means that the drain of the n-type MOSFET M2 and the drain of the n-type MOSFET M3 are connected in common to the P-well 23 via the P+ diffusion layer 31b and to the gate electrode of the n-type MOSFET M1a.

The semiconductor integrated circuit device structured as described is a modification of the fifth example, and the N+ diffusion layer 26b that corresponds to the drain of the MOSFET M2 and the P+ diffusion layer 31b are adjacent to each other. Further, the N+ diffusion layer 27b that corresponds to the drain of the MOSFET M3 and the P+ diffusion layer 31b are adjacent to each other, and the N+ diffusion layers 26b and 27b are both connected to the P+ diffusion layer 31b. These connections may be made by wiring as shown in FIG. 8 or by silicides formed on each surface of the N+ diffusion layers 26b and 27b, and the P+ diffusion layer 31b. The reason why the N+ diffusion layers 26b and 27b, and the P+ diffusion layer 31b can be disposed adjacent to each other is that the N+ diffusion layers 26b and 27b are connected in common to the P+ diffusion layer 31b, therefore there is no problem in connecting the diffusion layers to each other. By having such a structure, the occupation area of the ESD protection circuit can be further reduced as in Examples 3, 4 and 5.

In the above descriptions, the first, second and third MOS transistors have been described as n-type, however, they all may be p-type. In this case, n-type is replaced by p-type while p-type is replaced by n-type in the structure of the semiconductor integrated circuit device.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device, comprising:
   a pad for an input or output signal;
   a first MOSFET connected between said pad and a power supply wiring of a predetermined potential, said first MOSFET comprising a gate terminal and a backgate directly connected in common; and
   a second MOSFET of a same conductivity type as a conductivity type of, said first MOSFET, the second MOSFET comprising a gate terminal connected to said pad, a first terminal and a backgate directly connected to the gate terminal and the backgate of said first MOSFET, and a second terminal connected to said power supply wiring.

2. The semiconductor integrated circuit device as defined in claim 1, wherein said first MOSFET is configured to provide a threshold voltage larger than a p-n junction forward voltage.

3. The semiconductor integrated circuit device as defined in claim 1, further comprising a third MOSFET of a same conductivity type as the conductivity type of said first MOSFET, said third MOSFET comprising a gate terminal connected to said power supply wiring, a first terminal and backgate connected to the gate terminal and the backgate of said first MOSFET, and a second terminal connected to said pad.

4. A semiconductor integrated circuit device, comprising:
   a pad for an input or output signal;
   a first MOSFET connected between said pad and a power supply wiring of a potential V0, the first MOSFET comprising a gate terminal and backgate directly connected in common; and
   a potential control circuit that controls a potential Vb of the gate terminal and the backgate of said first MOSFET based on a potential Vin of said pad,
   wherein said potential control circuit controls so that, if said first MOSFET is an n-type, Vb=V0 when Vin≧V0+Vth (where Vth is a predetermined positive potential), and Vb=Vin when Vin<V0−Vth, and if said first MOSFET is a p-type, Vb=Vin when Vin≧V0+Vth, and Vb=V0 when Vin<V0−Vth.

5. The semiconductor integrated circuit device as defined in claim 4, wherein said potential control circuit comprises a second MOSFET and a third MOSFET, the second MOSFET and the third MOSFET each comprising a same conductivity type as a conductivity type of said first MOSFET,
   wherein said gate terminal and a backgate of said first MOSFET are directly connected to a backgate and first terminal of the second MOSFET and a backgate and first terminal of the third MOSFET,
   wherein said second MOSFET comprises a second terminal connected to said power supply wiring and a gate terminal connected to said pad, and
   wherein said third MOSFET comprises a second terminal connected to said pad and a gate terminal connected to said power supply wiring.

6. The semiconductor integrated circuit device as defined in claim 1, further comprising a resistance element provided between the gate terminal of said second MOSFET and said pad.

7. The semiconductor integrated circuit device as defined in claim 5, further comprising a resistance element provided between the gate terminal of said second MOSFET and said pad.

8. The semiconductor integrated circuit device as defined in claim 3, wherein said first, second, and third MOSFETs are disposed in a same well region.

9. The semiconductor integrated circuit device as defined in claim 5, wherein said first, second, and third MOSFETs are disposed in a same well region.

10. The semiconductor integrated circuit device as defined in claim 8, wherein a diffusion region relating to a second terminal of said first MOSFET and a diffusion region relating to the second terminal of said second MOSFET comprise a common region.

11. The semiconductor integrated circuit device as defined in claim 9, wherein a diffusion region relating to a second terminal of said first MOSFET and a diffusion region relating to the second terminal of said second MOSFET comprise a common region.

12. The semiconductor integrated circuit device as defined in claim 8, wherein a diffusion region relating to a first terminal of said first MOSFET and a diffusion region relating to the second terminal of said third MOSFET comprise a common region.

13. The semiconductor integrated circuit device as defined in claim 9, wherein a diffusion region relating to a first terminal of said first MOSFET and a diffusion region relating to the second terminal of said third MOSFET comprise a common region.

14. The semiconductor integrated circuit device as defined in claim 10, wherein a diffusion region relating to a first terminal of said first MOSFET and a diffusion region relating to the second terminal of said third MOSFET comprise a common region.

15. The semiconductor integrated circuit device as defined in claim 11, wherein a diffusion region relating to a first terminal of said first MOSFET and a diffusion region relating to the second terminal of said third MOSFET comprise a common region.

16. The semiconductor integrated circuit device as defined in claim 8, wherein a diffusion region relating to the first terminal of said second MOSFET and a diffusion region relating to the first terminal of said third MOSFET comprise a common region.

17. The semiconductor integrated circuit device as defined in claim 9, wherein a diffusion region relating to the first terminal of said second MOSFET and a diffusion region relating to the first terminal of said third MOSFET comprise a common region.

18. The semiconductor integrated circuit device as defined in claim 1, wherein said first and second MOSFETs are disposed in a same well region.

19. A semiconductor integrated circuit device, comprising:
   a first node connected to a pad;
   a first MOSFET connected between the first node and a power supply, the first MOSFET comprising a gate and a backgate, the gate and backgate directly connected in common; and
   a potential control circuit connected between the first node, a second node provided the gate and backgate of the first MOSFET, and a third node provided between the power supply and the first MOSFET,
   wherein the potential control circuit is configured to control a potential of the gate and backgate of the first MOSFET based on a potential provided to the pad, the potential of the gate being equal to the potential of the pad when the potential of the pad is greater than a predetermined threshold potential and the potential of the gate being zero when the potential of the pad is less than or equal to the predetermined threshold potential and the potential of the gate.

20. A semiconductor integrated circuit device according to claim 19, wherein the potential control circuit comprises:
   a second MOSFET having a gate associated with the first node, a backgate and drain directly associated with the second node, and a source connected to the third node; and
   a third MOSFET having a source directly connected to the first node, a gate connected to, a ground, and a backgate and drain directly connected to the second node.

* * * * *